(12) United States Patent
Gong

(10) Patent No.: US 11,133,353 B2
(45) Date of Patent: Sep. 28, 2021

(54) DISPLAY DEVICE HAVING A REFLECTIVE PORTION COVERED BANK SIDEWALL

(71) Applicant: LG Display Co., Ltd., Seoul (KR)

(72) Inventor: Hye-Jin Gong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 22 days.

(21) Appl. No.: 16/454,424

(22) Filed: Jun. 27, 2019

(65) Prior Publication Data

US 2020/0006438 A1   Jan. 2, 2020

(30) Foreign Application Priority Data

Jun. 29, 2018   (KR) ........................ 10-2018-0075745

(51) Int. Cl.
| | | |
|---|---|---|
| *H01L 27/32* | (2006.01) | |
| *H01L 51/50* | (2006.01) | |
| *H01L 51/52* | (2006.01) | |
| *G02B 27/01* | (2006.01) | |

(52) U.S. Cl.
CPC ...... *H01L 27/3209* (2013.01); *H01L 27/3246* (2013.01); *H01L 51/5056* (2013.01); *H01L 51/5271* (2013.01); *H01L 51/5275* (2013.01); *G02B 27/0172* (2013.01); *H01L 2227/32* (2013.01); *H01L 2251/53* (2013.01)

(58) Field of Classification Search
CPC ............. H01L 27/3209; H01L 27/3246; H01L 51/5056; H01L 51/5271; H01L 51/5275; H01L 27/3295
See application file for complete search history.

(56) References Cited

U.S. PATENT DOCUMENTS

| | | | | |
|---|---|---|---|---|
| 9,653,525 | B2 * | 5/2017 | Park | H01L 27/3246 |
| 10,211,269 | B2 * | 2/2019 | Shirahata | H01L 51/5268 |
| 10,224,501 | B2 * | 3/2019 | Choi | G06F 1/16 |
| 10,236,467 | B2 * | 3/2019 | Park | H01L 51/5076 |
| 10,388,703 | B2 * | 8/2019 | Park | H01L 51/56 |
| 10,505,139 | B2 * | 12/2019 | Bang | H01L 51/5209 |

(Continued)

FOREIGN PATENT DOCUMENTS

| | | | |
|---|---|---|---|
| CN | 110212006 A | * | 9/2019 |
| CN | 213071143 U | * | 4/2021 |

(Continued)

OTHER PUBLICATIONS

Office Action dated May 1, 2020, issued in corresponding Japanese Patent Application No. 2019-120649.

*Primary Examiner* — Ida M Soward
(74) *Attorney, Agent, or Firm* — Morgan, Lewis & Bockius LLP

(57) ABSTRACT

A display device includes a substrate provided with a first subpixel area, and a second subpixel area adjacent to one side of the first subpixel area, a first electrode provided on the substrate, including a first sub electrode provided on the first subpixel area and a second sub electrode provided on the second subpixel area, an organic light emitting layer arranged on the first electrode, a second electrode arranged on the organic light emitting layer, a bank provided between the first sub electrode and the second sub electrode, partitioning the first subpixel area from the second subpixel area, and a reflective portion provided on the bank, adjoining the organic light emitting layer.

20 Claims, 12 Drawing Sheets

(56) References Cited

U.S. PATENT DOCUMENTS

| | | | |
|---|---|---|---|
| 10,522,600 B2* | 12/2019 | Kim | H01L 27/3232 |
| 10,572,093 B2* | 2/2020 | Sonoda | G06F 3/0412 |
| 10,872,943 B2* | 12/2020 | Jun | H01L 27/3258 |
| 2015/0221893 A1 | 8/2015 | Teraguchi et al. | |
| 2017/0117338 A1* | 4/2017 | Shirahata | H01L 51/5203 |
| 2018/0006256 A1 | 1/2018 | Tojo | |
| 2020/0052049 A1* | 2/2020 | Lee | H01L 51/5271 |
| 2020/0321413 A1* | 10/2020 | Hong | H01L 27/3246 |

FOREIGN PATENT DOCUMENTS

| | | |
|---|---|---|
| JP | 2015-149194 A | 8/2015 |
| JP | 2016-018113 A | 2/2016 |
| JP | 2018-006067 A | 1/2018 |

* cited by examiner

| Second electrode | — 7 |
| Second electron transporting layer | — 623 |
| Second light emitting layer | — 622 } 62 |
| Second hole transporting layer | — 621 |
| Charge generating layer | — 63 |
| Reflective portion | — 81 ← 8 |
| First electron transporting layer | — 613 } 613a |
| First light emitting layer | — 612 } 61 |
| First hole transporting layer | — 611 |

FIG. 1D

PC-ETL that can selectively be patterned

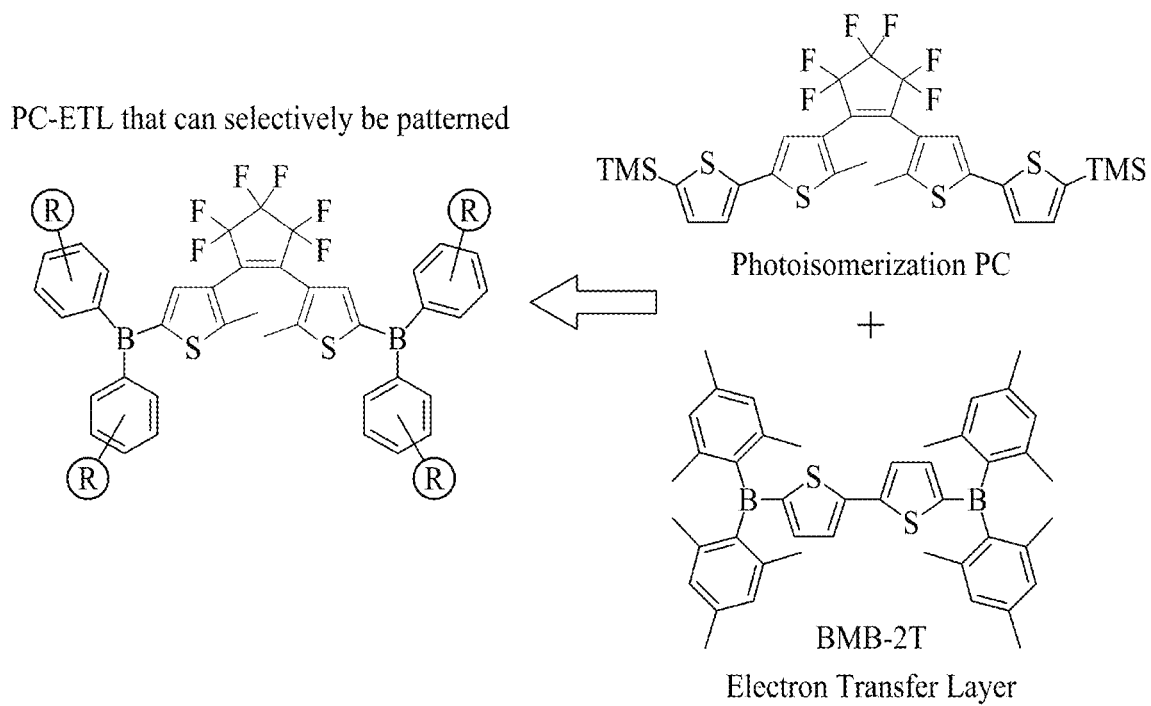

Photoisomerization PC

+

BMB-2T
Electron Transfer Layer

III-III

DISPLAY DEVICE HAVING A REFLECTIVE PORTION COVERED BANK SIDEWALL

BACKGROUND

Technical Field

The present disclosure relates to a display device displaying an image.

Description of the Related Art

With the advancement of the information age, the demand for a display device for displaying an image has increased with various forms. Therefore, various types of display devices such as a liquid crystal display (LCD) device, a plasma display panel (PDP) display device, and an organic light emitting display (OLED) device have been used.

Among the display devices, the organic light emitting display device is a self-light emitting device, and has advantages in that a viewing angle and a contrast ratio are more excellent than those of the liquid crystal display (LCD) device. Also, since the organic light emitting display device does not require a separate backlight, it is advantageous that the organic light emitting display device is able to be thin and lightweight and has low power consumption. Furthermore, the organic light emitting display device has advantages in that it may be driven at a low direct current voltage, has a fast response speed, and especially has a low manufacturing cost.

Recently, a head mounted display (HMD) including such an organic light emitting display device has been developed. The head mounted display is a glasses type monitor device of virtual reality (VR), which forms a focal point on a close distance in front of eyes of a user who wears the HMD in a glasses or helmet type.

On the other hand, the organic light emitting display device has a problem in that light emitted at a certain angle or more is emitted to an adjacent pixel or subjected to waveguide, whereby a color mixture and light loss caused by a viewing angle occur. This problem occurs more seriously in case of a head mounted display (HMD) including an organic light emitting display device. Therefore, studies for a head mounted display with ultra-high resolution that can prevent a color mixture and light loss from occurring have been actively ongoing.

SUMMARY

Accordingly, embodiments of the present disclosure are directed to a display device that substantially obviates one or more of the problems due to limitations and disadvantages of the related art.

The present disclosure has been made in view of the above problems, and an aspect of the present disclosure to provide a display device that can prevent a color mixture and light loss from occurring.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a substrate provided with a first subpixel area, and a second subpixel area adjacent to one side of the first subpixel area, a first electrode provided on the substrate, including a first sub electrode provided on the first subpixel area and a second sub electrode provided on the second subpixel area, an organic light emitting layer arranged on the first electrode, a second electrode arranged on the organic light emitting layer, a bank provided between the first sub electrode and the second sub electrode, partitioning the first subpixel area from the second subpixel area, and a reflective portion provided on the bank, adjoining the organic light emitting layer.

In the display device according to the present disclosure, as the reflective portion adjoining the organic light emitting layer is provided on the bank, the reflective portion may reflect light, which is emitted from the first subpixel area, toward the first subpixel area to prevent the light from entering the second subpixel area adjacent to the first subpixel area through the bank, so that light loss as well as a color mixture may be prevented from occurring, whereby light efficiency may be improved.

It is to be understood that both the foregoing general description and the following detailed description are exemplary and explanatory and are intended to provide further explanation of the inventive concepts as claimed.

BRIEF DESCRIPTION OF THE DRAWINGS

The above and other objects, features and other advantages of the present disclosure will be more clearly understood from the following detailed description taken in conjunction with the accompanying drawings, in which:

FIG. 1b is a brief cross-sectional view taken along line I-I shown in FIG. 1a;

FIG. 1c is a view illustrating a brief layer structure of line II-II shown in FIG. 1b;

FIG. 1d is a chemical structure of one example using a photoisomerization organic material;

FIG. 2b is a view illustrating a brief layer structure of line III-III shown in FIG. 2a;

FIG. 4b is a view illustrating a brief layer structure of line IV-IV shown in FIG. 4a;

FIG. 6b is an exemplary view illustrating a storage case of FIG. 6a.

DETAILED DESCRIPTION

Figure 1A:
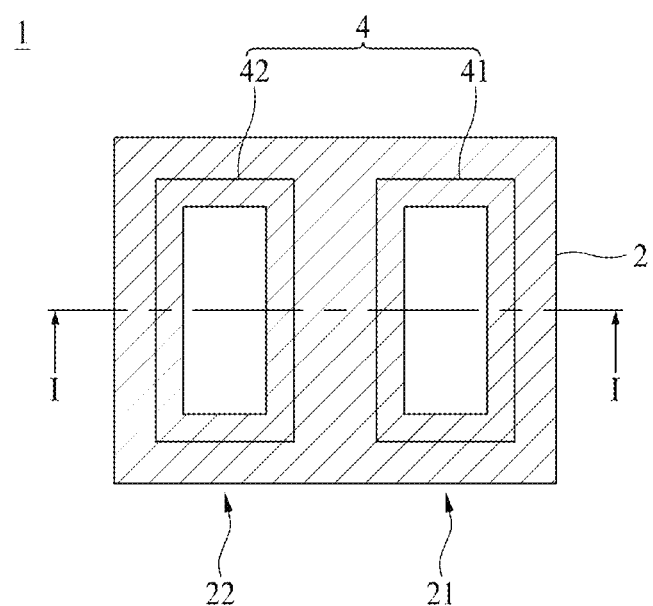
FIG. 1a is a brief plane view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the embodiments of the display device according to the present disclosure will be described in detail with reference to the accompanying drawings. Wherever possible, the same reference numbers will be used throughout the drawings to refer to the same or like parts.

Figure 1B:
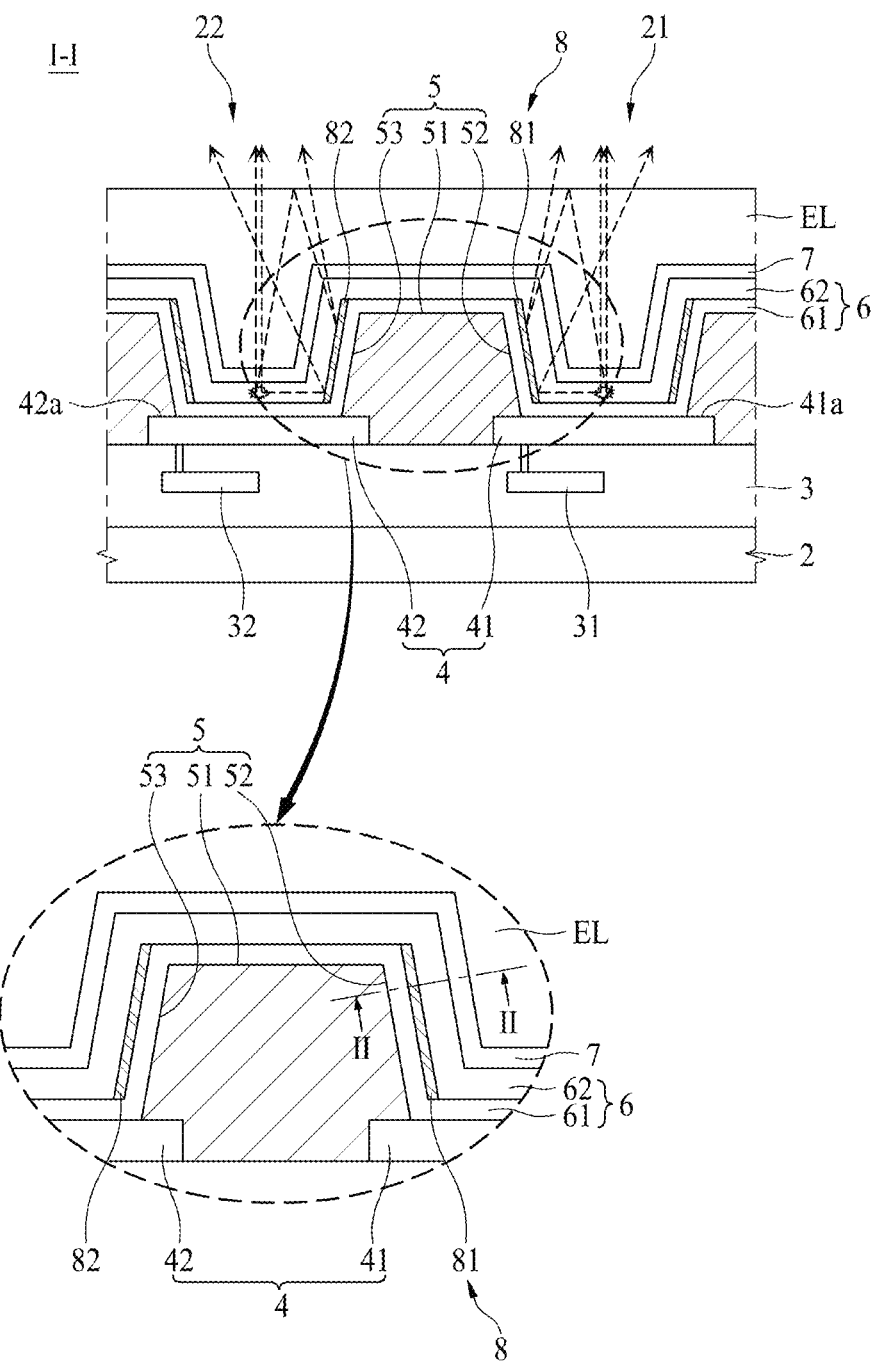
Figure 1E:
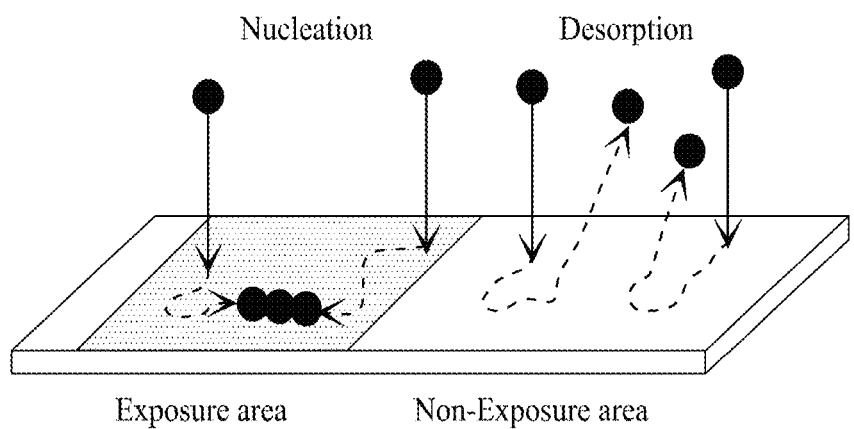
FIG. 1e is an exemplary view illustrating a case that a photoisomerization organic material is exposed to light and a case that photoisomerization organic material is not exposed to light.
Figure 1F:
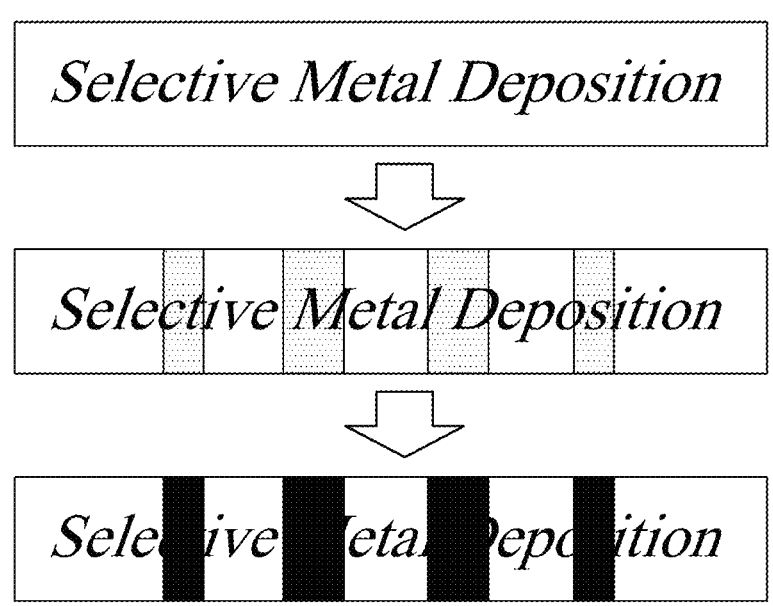
FIG. 1f is a view illustrating one example of selective metal patterning using a photisomerization organic material.

FIG. 1a is a brief plane view illustrating a display device according to one embodiment of the present disclosure, FIG. 1b is a brief cross-sectional view taken along line I-I shown in FIG. 1a, FIG. 1c is a view illustrating a brief layer structure of line II-II shown in FIG. 1b, FIG. 1d is a chemical structure of one example using a photoisomerization organic material, FIG. 1e is an exemplary view illustrating a case that a photoisomerization organic material is exposed to light and a case that photoisomerization organic material is not exposed to light, and FIG. 1f is a view illustrating one example of selective metal patterning using a photoisomerization organic material.

Referring to FIGS. 1a to 1f, the display device 1 according to one embodiment of the present disclosure comprises a substrate 2, a circuit element layer 3, a first electrode 4, a bank 5, an organic light emitting layer 6, a second electrode 7, and a reflective portion 8.

The substrate 2 may be a semiconductor substrate such as a plastic film, a glass substrate, or silicon.

The substrate 2 may include a first subpixel area 21 and a second subpixel area 22. The second subpixel area 22 according to one example may be arranged to adjoin one side of the first subpixel area 21.

Referring to FIG. 1a, the first subpixel area 21 and the second subpixel area 22 may emit light of various colors including white.

Each of the first subpixel area 21 and the second subpixel area 22 may include an organic light emitting diode that includes a first electrode 4, an organic light emitting layer 6, and a second electrode 7.

The circuit element layer 3 is arranged on one surface of the substrate 2. The circuit element layer 3 may include a plurality of transistors 31 and 32, gate lines, data lines, and subpixels. The subpixels are provided in an area defined by a crossing structure of the gate lines and the data lines.

The first transistor 31 and the second transistor 32 are arranged for each of the subpixel areas 21 and 22 in the circuit element layer 3. The first transistor 31 according to one example may be connected to a first sub electrode 41 arranged on the first subpixel area 21 to apply a driving voltage for emitting light of a color corresponding to the first subpixel area 21.

The second transistor 32 according to one example may be connected to a second sub electrode 42 arranged on the second subpixel area 22 to apply a driving voltage for emitting light of a color corresponding to the second subpixel area 22.

Each of the first subpixel area 21 and the second subpixel area 22 according to one example provides an organic light emitting diode with a predetermined current by using its transistor 31 or 32 in accordance with a data voltage of a data line when a gate signal from a gate line is input thereto. For this reason, the organic light emitting diode of each of the first subpixel area 21 and the second subpixel area 22 may emit light with predetermined brightness in accordance with a predetermined current.

The first electrode 4 is provided on the substrate 2. The first electrode 4 according to one example may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu). The first electrode 4 may be an anode. The first electrode 4 may include a first sub electrode 41 and a second sub electrode 42.

The first sub electrode 41 may be provided in the first subpixel area 21. The first sub electrode 41 may be provided on the circuit element layer 3. The first sub electrode 41 is connected to a source electrode of the first transistor 31 through a contact hole that passes through the circuit element layer 3.

The second sub electrode 42 may be provided in the second subpixel area 22. The second sub electrode 42 may be provided on the circuit element layer 3. The second sub electrode 42 is connected to a source electrode of the second transistor 32 through the contact hole that passes through the circuit element layer 3.

Referring to FIG. 1b, the bank 5 is provided between the first sub electrode 41 and the second sub electrode 42. The bank 5 may be included in a bank area (area with slashes in FIG. 1a) surrounding the first sub electrode 41 and the second sub electrode 42. The bank 5 according to one example is to partition the first subpixel area 21 from the second subpixel area 22. The bank 5 serves to define a subpixel area, that is, a light emitting portion. Also, since an area where the bank 5 is formed does not emit light, the area may be defined as a non-light emitting portion. The bank 5 may be formed of an organic film such as acryl resin, epoxy resin, phenolic resin, polyamide resin, and polyimide resin. The organic light emitting layer 6 is formed on the first electrode 4 and the bank 5.

Referring to FIG. 1b, the bank 5 may include a top surface 51, a first inclined surface 52, and a second inclined surface 53.

The top surface 51 of the bank 5 is a surface arranged on the upper side in the bank 5.

The first inclined surface 52 of the bank 5 is a surface extended from the top surface 51 to a top surface 41a of the first sub electrode 41. Therefore, the first inclined surface 52 and the top surface 41a of the first sub electrode 41 may have a predetermined angle. The predetermined angle may be 50° or more and less than 90° as a width of the bank becomes narrow due to high resolution of the display device. The width of the bank may become narrow as a distance between the subpixel areas becomes narrow. Therefore, in the display device 1 according to one embodiment of the present disclosure, light emitted from the first subpixel area 21 may not be totally reflected to the bank 5 but enter the inside of the bank 5. Therefore, as the display device 1 according to one embodiment of the present disclosure comprises the reflective portion 8 on the first inclined surface 52 to allow light not to enter the inside of the bank 5, the reflective portion 8 may reflect light emitted from the first sub pixel area 21, moving to the bank 5 to emit the light to the first subpixel area 21.

The second inclined surface 53 of the bank 5 is a surface extended from the top surface 51 to a top surface 42a of the second sub electrode 42. Therefore, the second inclined surface 53 and the top surface 42a of the second sub electrode 42 may have a predetermined angle. The angle between the second inclined surface 53 and the top surface 42a of the second sub electrode 42 may be equal to the angle between the first inclined surface 52 and the top surface 41a of the first sub electrode 41. Therefore, as the display device 1 according to one embodiment of the present disclosure comprises the reflective portion 8 on the second inclined surface 53 to allow light not to enter the inside of the bank 5 through the second inclined portion 53, the reflective portion 8 may reflect light emitted from the second sub pixel area 22, moving to the bank 5, so as to emit the light to the second subpixel area 22.

The organic light emitting layer 6 is arranged on the first electrode 4. The organic light emitting layer 6 according to one example is a common layer commonly formed on the first subpixel area 21 and the second subpixel area 22, and may be a white light emitting layer emitting white light. In this case, the organic light emitting layer 6 may be formed with a tandem structure including two stacks or more. Each of the stacks may include a hole transporting layer (HTL), at least one light emitting layer, and an electron transporting layer (ETL). When a high potential voltage is applied to the first electrode 4 and a low potential voltage is applied to the second electrode 7, holes and electrons are moved to the organic light emitting layer 6 through the hole transporting layer and the electron transporting layer, respectively and are combined with each other in the organic light emitting layer 6 to emit light.

For example, the organic light emitting layer 6 is comprised of a plurality of organic layers, wherein the plurality of organic layers include a first stack 61, a second stack 62, and a charge generating layer 63 provided between the first stack 61 and the second stack 62. The first stack 61 may include a first hole transporting layer 611, a first light emitting layer 612 emitting light of a first color, and a first electron transporting layer 613. The second stack 62 may include a second hole transporting layer 621, a second light emitting layer 622 emitting light of a second color, and a second electron transporting layer 623.

Also, the charge generating layer 63 may be formed between the stacks 61 and 62. The charge generating layer 63 may include an n-type charge generating layer arranged to be adjacent to the first stack 61 and a p-type charge generating layer formed on the n-type charge generating layer and arranged to be adjacent to the second stack 62. The n-type charge generating layer injects electrons into the first stack 61, and the p-type charge generating layer injects holes into the second stack 62. The n-type charge generating layer may be comprised of an organic layer doped with alkali metal such as Li, Na, K, or Cs or alkali earth metal such as Mg, Sr, Ba, or Ra. The p-type charge generating layer may be made by doping a dopant on an organic material that is capable of transporting holes.

The reflective portion 8 may adjoin the organic light emitting layer 6. If the organic light emitting layer 6 according to one example includes a plurality of organic layers, the organic layer provided below the reflective portion 8 while adjoining the reflective portion 8 may include a photoisomerization organic material. The photoisomerization organic material is a material that enables a selective deposition of metal. For example, the photoisomerization organic material may be a photo chromic. As the organic layer provided below the reflective portion 7 includes a photoisomerization organic material such as photo chromic, the reflective portion 7 containing metal may easily be deposited in or on the organic light emitting layer 6.

The photoisomerization organic material will be described in more detail. FIG. 1d illustrates that the photoisomerization organic material is included in the electron transporting layer ETL as an example. In FIG. 1d, a lower portion illustrates a chemical structure of the electron transporting layer in which sulfur (S) and boron (B) are chemically combined with each other, and an upper portion illustrates a chemical structure of the photoisomerization organic material in which S and fluorine (F) are chemically combined with each other. If the electron transporting layer containing the photoisomerization organic material is exposed to light such as UV, the electron transporting layer may be isomerized to a chemical structure having a functional group R on which metal is well deposited, as shown in a left side of FIG. 1d.

In more detail, if the photoisomerization organic material is exposed to light, the photoisomerization organic material is subjected to nucleation as shown in a left side of FIG. 1e, whereby a metal material may well be deposited on the photoisomerization organic material. If the photoisomerization organic material is not exposed to light, the photoisomerization organic material is subjected to desorption as shown in a right side of FIG. 1e, whereby a metal material may not be well deposited on the photoisomerization organic material. A deposition rate of the photoisomerization organic material may be changed in accordance with a phase change due to a glass transition phenomenon which is derived for a photoreaction.

Referring to FIG. 1f, after a photoisomerization organic material is deposited or doped on an organic layer of a first drawing as shown in a second drawing, light is exposed to only a portion where a metal material will be deposited and then a metal material is deposited as shown in a third drawing, whereby the metal material is deposited on only an area where the photoisomerization organic material is isomerized.

Therefore, in the display device 1 according to one embodiment of the present disclosure, since a meal can selectively be patterned using a photo chromic material to which a function group R which derives selective deposition of the metal is applied, the metal may easily be patterned without a complicated process and various metals having high thermal stability may be deposited and patterned.

The second electrode 7 is arranged on the organic light emitting layer 6. The second electrode 7 according to one example is a common layer commonly formed on the first subpixel area 21 and the second subpixel area 22. The second electrode 7 may be formed of a transparent conductive materials (TCO) such as ITO and IZO that are capable of transmitting light or a semi-transmissive conductive material such as Mg, Ag, or an alloy of Mg and Ag.

An encapsulation layer EL may be formed on the second electrode 7. The encapsulation layer EL serves to prevent oxygen or water from being permeated into the organic light emitting layer 6 and the second electrode 7. To this end, the encapsulation layer EL may include at least one inorganic film and at least one organic film.

For example, the encapsulation layer EL may include a first inorganic film, an organic film, and a second inorganic film. In this case, the first inorganic film is formed to cover the second electrode 7. The organic film is formed to cover the first inorganic film. It is preferable that the organic film is formed at a sufficient thickness to prevent particles from being permeated into the organic light emitting layer 6 and the second electrode 7 by passing through the first inorganic film. The second inorganic film is formed to cover the organic film.

In FIG. 1b, only up to the encapsulation layer EL arranged on the second electrode 7 is shown for convenience of description. In the case that an organic light emitting diode includes only white organic light emitting diode, red, green and blue color filters may be arranged on the encapsulation layer to embody red, green and blue colors. In this case, a black matrix (BM) may be arranged between the color filters to partition the color filters. In the case that the organic light emitting diode includes red, green and blue organic light emitting diodes to emit light of red, green and blue colors, the red, green and blue color filters may not be arranged on the encapsulation layer.

Referring to FIG. 1b again, most of light emitted from the first subpixel area 21 is emitted to the encapsulation layer EL, and a portion of the light is reflected on a boundary surface of SiNx of the encapsulation EL and again enters the bank 5 and another portion of the light, which has an incident angle greater than a threshold angle, is subjected to total reflection (hereinafter, referred to as 'waveguide') between the encapsulation layer EL and the first electrode 4, whereby a light path may be formed toward the bank 5.

For example, if light emitted from the first subpixel area 21 and reflected on the boundary surface of SiNx of the encapsulation layer EL enters the bank 5, the light is reflected to the second sub electrode 42 of the second subpixel area 22 adjacent to the bank 5 by transmitting the bank 5 and then emitted to the second subpixel area 22, whereby a problem occurs in that a color of the first subpixel area 21 is mixed with a color of the second subpixel area 22.

Meanwhile, if the light emitted from the first sub pixel area 21 is subjected to waveguide to form a light path toward the bank 5, light is emitted from an edge of a panel or light becomes extinct without contributing to light emission efficiency of the first subpixel area 21, whereby problems occur in that panel luminance is deteriorated and power consumption is increased.

To solve the aforementioned problems, the display device 1 according to one embodiment of the present disclosure may comprise a reflective portion 8.

Referring to FIG. 1b, the reflective portion 8 may be provided on the bank 5 and adjoin the organic light emitting layer 6. The reflective portion 8 is provided on the bank 5 to allow light emitted from the organic light emitting layer 6 not to enter the bank 5, thereby reflecting the light. For example, the reflective portion 8 may reflect light emitted from the organic light emitting layer 6 and reflected on the boundary surface of SiNx of the encapsulation layer EL or subjected to waveguide to move to the bank 5. Therefore, the reflective portion 8 may reflect light emitted from the first subpixel area 21, moving to the first inclined surface 52 and then emit the light to the first subpixel area 21.

The reflective portion 8 may be formed of, but not limited to, a material that includes a metal, and may be formed of another material that can reflect light moving to the bank 5. If the reflective portion is formed of a material that includes metal, reflectivity for reflecting light may be more enhanced than the case that the reflective portion is formed of another material.

Meanwhile, the reason why the reflective portion 8 is arranged to adjoin the organic light emitting layer 6 is that at least one of a plurality of organic layers constituting the organic light emitting layer 6 may include a photoisomerization organic material to easily deposit the reflective portion 8 including metal on the organic layer of the organic light emitting layer 6.

The reflective portion 8 according to one example may be arranged to adjoin the organic light emitting layer 6 on the first inclined surface 52 and the second inclined surface 53 of the bank 5. The reflective portion 8 may include a first reflective portion 81 arranged on the first inclined surface 52 and a second reflective portion 82 arranged on the second inclined surface 53.

The first reflective portion 81 may reflect light to the first subpixel area 21 so that the light emitted from the first subpixel area 21 and reflected on the boundary surface of the encapsulation layer or subjected to waveguide may not enter the bank 5 through the first inclined surface 52. Therefore, the display device 1 according to one embodiment of the present disclosure may prevent the color of the first subpixel area 21 from being mixed with the color of the second subpixel area 22 and change the light path from the bank 5 to the first subpixel area 21 to avoid light loss, whereby light efficiency may be improved.

The second reflective portion 82 may reflect light to the second subpixel area 22 so that the light emitted from the second subpixel area 22 and reflected on the boundary surface of the encapsulation layer or subjected to waveguide may not enter the bank 5 through the second inclined surface 53. Therefore, the display device 1 according to one embodiment of the present disclosure may prevent the color of the second subpixel area 22 from being mixed with the color of the first subpixel area 21 and change the light path from the bank 5 to the second subpixel area 22 to avoid light loss, whereby light efficiency may be improved.

Referring to FIGS. 1b and 1c, in the display device 1 according to one embodiment of the present disclosure, the reflective portion 8 may be arranged inside the organic light emitting layer 6. For example, if the organic light emitting layer 6 is comprised of a plurality of organic layers, the reflective portion 8 may be provided between any two of the plurality of organic layers. Referring to FIG. 1c, if the organic light emitting layer 6 is comprised of the plurality of organic layers that include a first stack 61 including a first electron transporting layer 613, a second stack 62 arranged on the first stack 61, including a second electron transporting layer 623, and a charge generating layer 63 provided between the first stack 61 and the second stack 62, the reflective portion 8 according to one example may be provided on a top surface 613a of the first electron transporting layer 613 and thus arranged inside the organic light emitting layer 6.

In the display device 1 according to one embodiment of the present disclosure, as the first electron transporting layer 613 may be embodied to include a photoisomerization organic material, the reflective portion 8 may be arranged on, but not limited to, the top surface 613a of the first electron transporting layer 61. If the reflective portion 8 may be arranged to adjoin the organic light emitting layer 6, the photoisomerization organic material may be included in the other organic layer except the first electron transporting layer 613 so that the reflective portion 8 may be arranged inside or outside the organic light emitting layer 6.

In the display device 1 according to one embodiment of the present disclosure, since the first electron transporting layer 613 may include the photoisomerization organic material more easily than the other organic layers, the reflective portion 8 is arranged on the top surface 613a of the first electron transporting layer 613. Therefore, in the display device 1 according to one embodiment of the present disclosure, since the reflective portion 8 may easily be deposited on the top surface 613a of the first electron transporting layer 613, the manufacturing time of the completed display device may be reduced as compared with the case that the other organic layer includes a photoisomerization organic material.

Figure 2A:
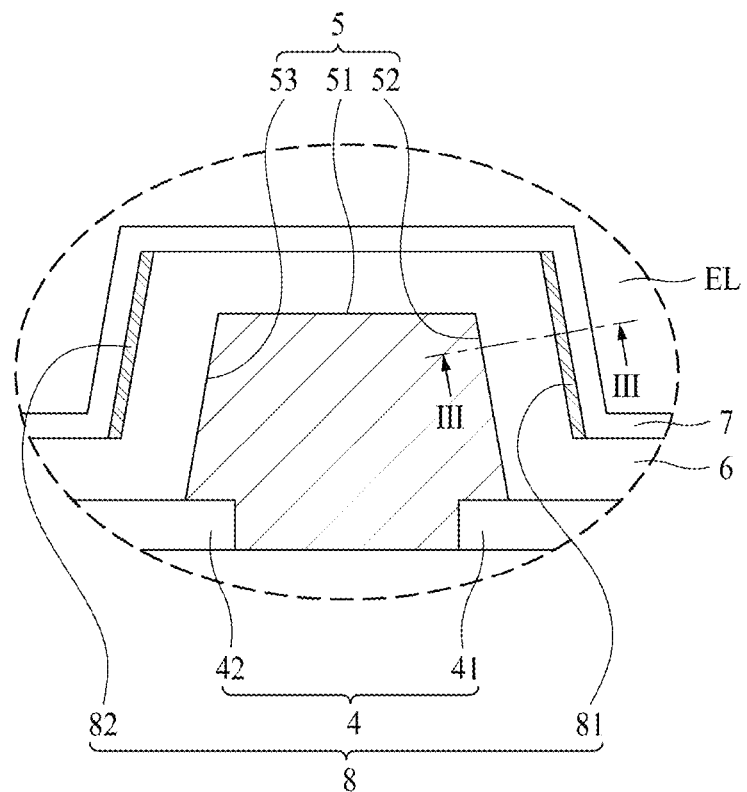
FIG. 2a is a brief cross-sectional view illustrating a display device according to the second embodiment of the present disclosure.
Figure 2B:
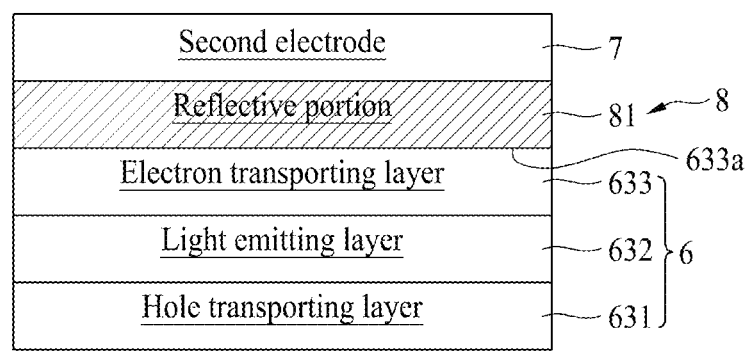

FIG. 2a is a brief cross-sectional view illustrating a display device according to the second embodiment of the present disclosure, and FIG. 2b is a view illustrating a brief layer structure of line III-III shown in FIG. 2a.

Referring to FIG. 2a, in the display device 1 according to the second embodiment of the present disclosure, the reflective portion 8 may be arranged on a top surface of the organic light emitting layer 6.

For example, as shown in FIG. 2b, if the organic light emitting layer 6 includes a hole transporting layer 631, a light emitting layer 632 and an electron transporting layer 623, the first reflective portion 81 and the second reflective portion 82 may be provided on the top surface 633a of the electron transporting layer 633. Since the hole transporting layer 631, the light emitting layer 632 and the electron transporting layer 633 respectively correspond to the first hole transporting layer 611, the first light emitting layer 612 and the first electron transporting layer 613 of the display device 1 according to one embodiment of the present disclosure, their detailed description will be omitted.

In the display device 1 according to the second embodiment of the present disclosure, as the electron transporting layer 633 is embodied to include a photoisomerization organic material, the reflective portion 8 may easily be arranged on the top surface 633a of the electron transporting layer 633, that is, the top surface of the organic light emitting layer 6. Therefore, in the display device 1 according to the second embodiment of the present disclosure, as the light emitted from the first subpixel area 21 or the second subpixel area 22 may be prevented from entering an adjacent subpixel area, the color of the subpixel area from which light is emitted may be prevented from being mixed with the color of the subpixel area from which light is not emitted and the path of the light emitted from the subpixel area, moving to the bank 5 may be changed toward the subpixel area from which light is emitted, whereby light efficiency may be improved.

In the display device 1 according to the second embodiment of the present disclosure, as the reflective portion 8 is arranged on the top surface of the organic light emitting layer 6, that is, the outermost, the manufacturing process may be more simplified than the case that the reflective portion 8 is arranged inside the organic light emitting layer 6, whereby the manufacturing time of the completed display device may be more reduced.

Also, in the display device 1 according to the second embodiment of the present disclosure, as the reflective portion 8 is arranged on the outermost of the organic light emitting layer 6 arranged on the inclined surfaces 81 and 82, the light emitted from the organic light emitting layer 6 may be more shielded from entering the organic light emitting layer arranged on the inclined surfaces 81 and 82, whereby a color mixture may be avoided more efficiently.

Figure 3:
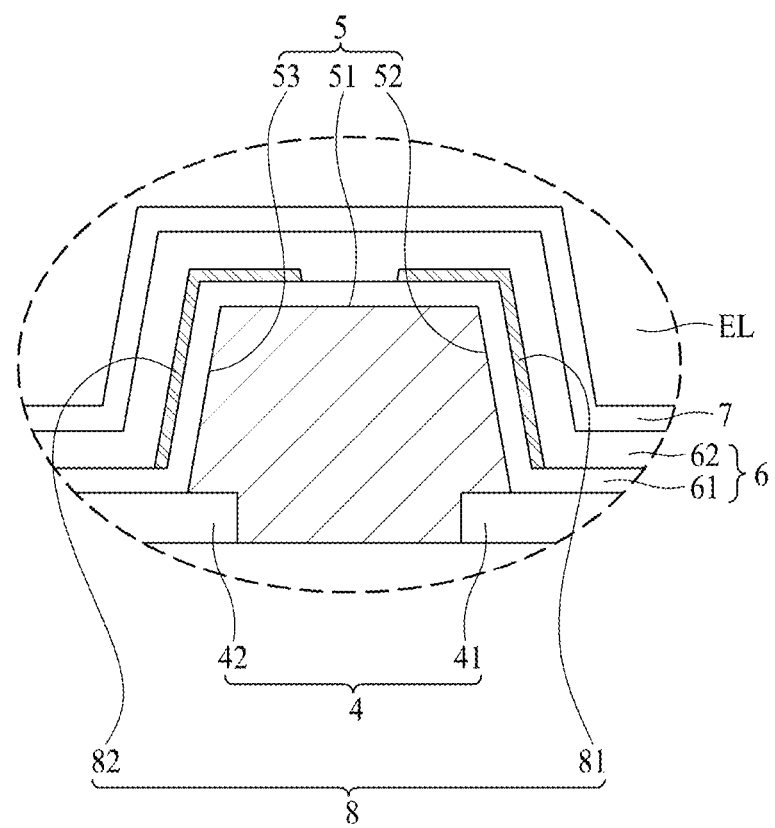
FIG. 3 is a brief cross-sectional view illustrating a display device according to the third embodiment of the present disclosure.

FIG. 3 is a brief cross-sectional view illustrating a display device according to the third embodiment of the present disclosure.

Referring to FIG. 3, in the display device 1 according to the third embodiment of the present disclosure, the first reflective portion 81 may be extended to the top surface 51 of the bank 5. In this case, the first reflective portion 81 may be provided to cover only one side of the top surface 51 of the bank 5. Therefore, the first reflective portion 81 may be formed to be bent to partially cover the top surface 51 of the bank 5 as well as the first inclined surface 52 of the bank 5. Therefore, in the display device 1 according to the third embodiment of the present disclosure, the first reflective portion 81 may prevent the light emitted from the first subpixel area 21 from entering the bank 5 through a portion of the top surface 51 of the bank 5 as well as the first inclined surface 52 of the bank 5, whereby the color of the first subpixel area 21 may be more prevented from being mixed with the color of the second subpixel area 22 than one example and the second embodiment of the present disclosure.

Also, in the display device 1 according to the third embodiment of the present disclosure, the second reflective portion 82 may be extended to the top surface 51 of the bank 5. In this case, the second reflective portion 81 may be provided to cover only the other side of the top surface 51 of the bank 5. Therefore, the second reflective portion 82 may be formed to be fully bent to partially cover the top surface 51 of the bank 5 as well as the second inclined surface 53 of the bank 5. Therefore, in the display device 1 according to the third embodiment of the present disclosure, the second reflective portion 82 may prevent the light emitted from the second subpixel area 22 from entering the bank 5 through a portion of the top surface 51 of the bank 5 as well as the second inclined surface 53 of the bank 5, whereby the color of the second subpixel area 22 may be more prevented from being mixed with the color of the first subpixel area 21 than one example and the second embodiment of the present disclosure.

Meanwhile, in the display device 1 according to the third embodiment of the present disclosure, the second reflective portion 82 and the first reflective portion 81 may be embodied to be spaced apart from each other on the top surface 51 of the bank 5. For example, if the first reflective portion 81 and the second reflective portion 82 are connected with each other on the top surface 51 of the bank 5, a current applied to the organic light emitting layer 6 of the first subpixel area 21 leaks to the organic light emitting layer 6 of the second subpixel area 22 when light is emitted from the first subpixel area 21, whereby light may also be emitted from the second subpixel area 22. Therefore, in the display device 1 according to the third embodiment of the present disclosure, the second reflective portion 82 and the first reflective portion 81 may be spaced apart from each other on the top surface 51 of the bank 5, whereby a leakage current may be prevented from occurring between adjacent subpixel areas.

Referring to FIG. 3, in the display device 1 according to the third embodiment of the present disclosure, the first reflective portion 81 extended to the top surface 51 of the bank 5 is embodied to be arranged in parallel with the top surface 51 of the bank 5. However, without limitation to this example, the extended portion of the first reflective portion 81 may be embodied to be inclined with respect to the top surface of the bank 5 such that the light emitted from the first subpixel area 21 and reflected to the first reflective portion 81 may be more inclined toward the first subpixel area 21, or the extended portion of the first reflective portion 81 may be embodied to a variable thickness. This characteristic may equally be applied to the second reflective portion 82.

Figure 4A:
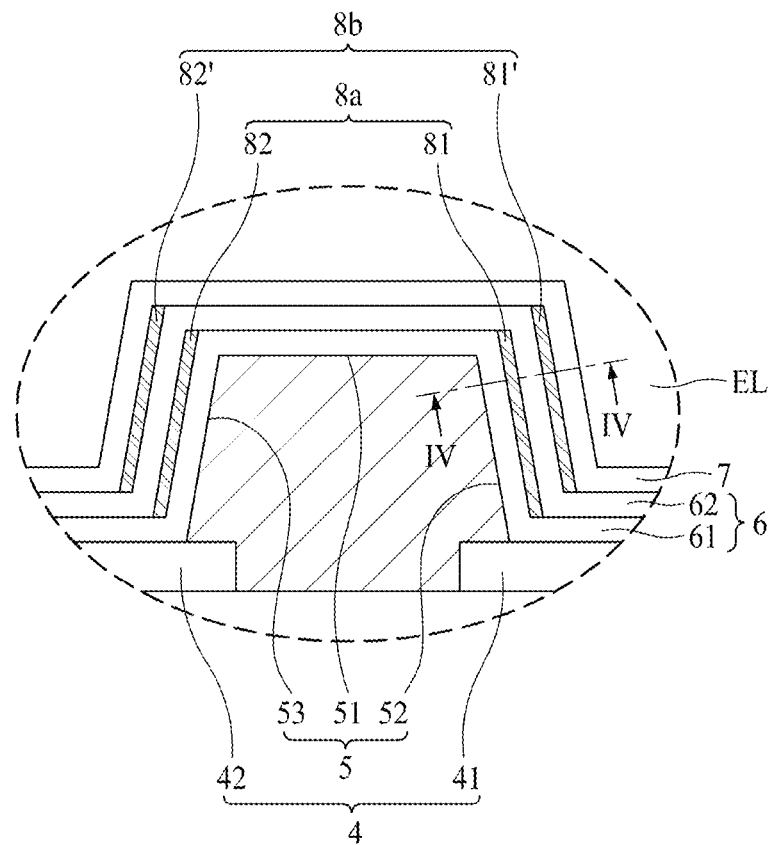
FIG. 4a is a brief cross-sectional view illustrating a display device according to the fourth embodiment of the present disclosure.
Figure 4B:
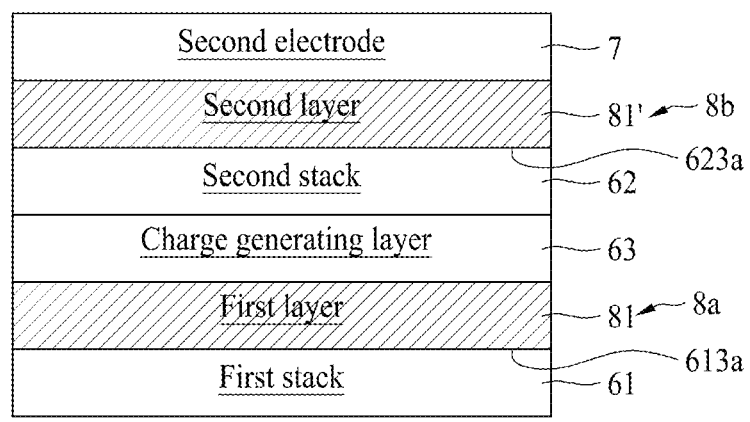

FIG. 4*a* is a brief cross-sectional view illustrating a display device according to the fourth embodiment of the present disclosure, and FIG. 4*b* is a view illustrating a brief layer structure of line IV-IV shown in FIG. 4*a*.

Referring to FIG. 4*a*, in the display device 1 according to the fourth embodiment of the present disclosure, the reflective portion 8 may include a plurality of layers. For example, the reflective portion 8 may include a first layer 8*a* provided inside the organic light emitting layer 6, and a second layer 8*b* provided inside or on the organic light emitting layer 6 while being spaced apart from the first layer 8*a*.

Referring to FIG. 4*b*, in the display device 1 according to the fourth embodiment of the present disclosure, if the organic light emitting layer 6 includes a first stack 61, a second stack 62, and a charge generating layer 63 provided between the first stack 61 and the second stack 62, the first layer 8*a* may be provided on the top surface 613*a* of the first electron transporting layer of the first stack 61, and the second layer 8*b* may be provided on the top surface 623*a* of the second electron transporting layer of the second stack 62. Since the first stack 61, the second stack 62, the top surface 613*a* of the first electron transporting layer and the top surface 623*a* of the second electron transporting layer are embodied to be matched with the first stack 61, the second stack 62, the top surface 613*a* of the first electron transporting layer and the top surface 623*a* of the second electron transporting layer according to one embodiment of the present disclosure, their detailed description will be omitted.

The first layer 8*a* may include a first reflective portion 81 arranged on the first inclined surface 52, and a second reflective portion 82 arranged on the second inclined surface 53. Therefore, the first layer 8*a* may reflect light emitted from the second light emitting layer 622 of the second stack 62 as well as light emitted from the first light emitting layer 612 of the first stack 61 to allow the light not to enter the bank 5. Particularly, since the first layer 8*a* is arranged inside the organic light emitting layer 6, the first layer 8*a* may reflect the light emitted from the second light emitting layer 622 of the second stack 62, moving to a side by waveguide more efficiently than the second layer 8*b* arranged on the top surface of the organic light emitting layer 6.

The second layer 8*b* may include a first reflective portion 81' arranged on the first inclined surface 52, and a second reflective portion 82' arranged on the second inclined surface 53. Since the second layer 8*b* is arranged on the top surface of the organic light emitting layer 6, the second layer 8*b* may primarily reflect light emitted from the second light emitting layer 622 of the second stack 62 as well as light emitted from the first light emitting layer 612 of the first stack 61 to allow the light not to enter the bank 5.

On the other hand, as the first layer 8*a* is arranged inside the organic light layer 6 more inwardly than the second layer 8*b*, the first layer 8*a* may secondarily reflect light moving to the bank 5 after transmitting the second layer 8*b*. Therefore, in the display device 1 according to the fourth embodiment of the present disclosure, since the reflective portion 8 is formed in a double structure of a first layer 8*a* and a second layer 8*b*, the reflective portion 8 may more prevent light from entering the bank 5 than one embodiment of the present disclosure, whereby a color mixture may more effectively be prevented from occurring and light efficiency may be more increased.

FIGS. 5*a* to 5*g* are brief process views illustrating a display device according to one embodiment of the present disclosure.

Figure 5A:
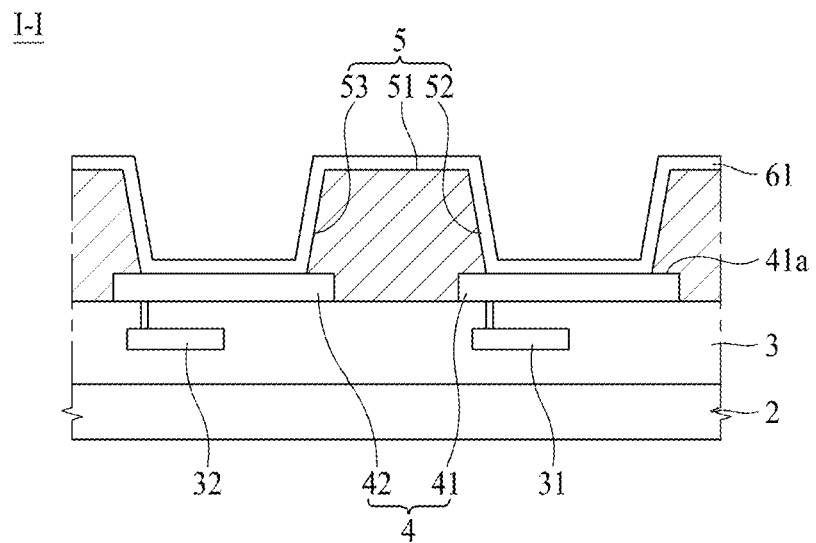
FIGS. 5a to 5g are brief process views illustrating a display device according to one embodiment of the present disclosure.

First of all, referring to FIG. 5*a*, the first hole transporting layer 611, the first light emitting layer 612 and the first electron transporting layer 613 containing a photoisomerization organic material are sequentially deposited on the first electrode 4 to form the first stack 61. The first electrode 4 may be arranged on the substrate 2 and the circuit element layer 3.

Figure 5B:
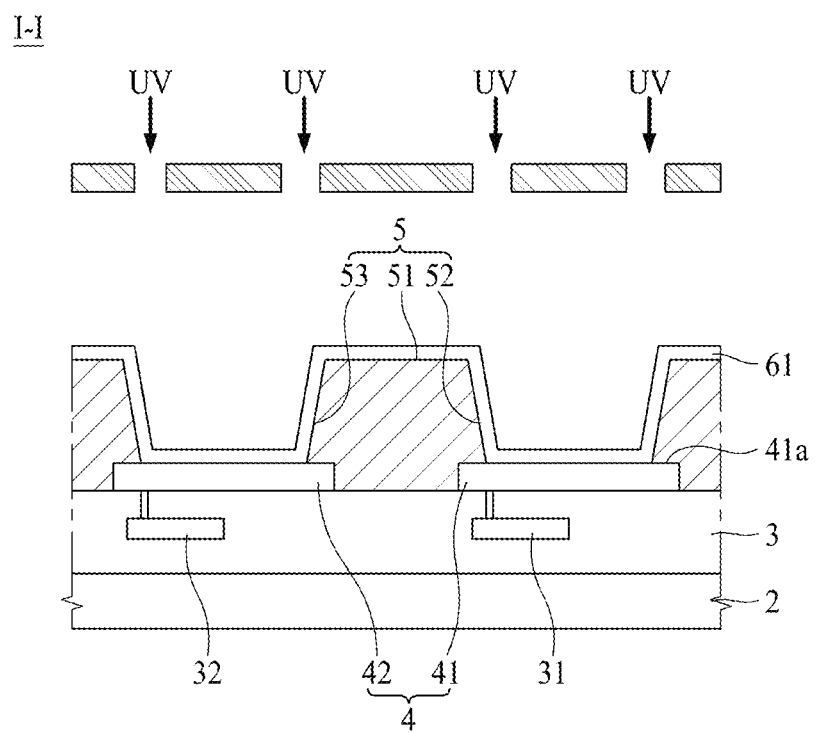

Next, referring to FIG. 5*b*, other portion except a position where the reflective portion 8 will be arranged on the first electron transporting layer 613 is covered with a mask and then UV is irradiated to the other portion. For example, the position where the reflective portion 8 will be arranged may be a position except the light emitting portion, and may be an upper side of each of the first inclined surface 52 and the second inclined surface 53 of the bank 5. In the third embodiment of the present disclosure, a size of a UV irradiation area of the mask may be more widened so that the top surface of the bank 5 may partially be exposed to UV.

Figure 5C:
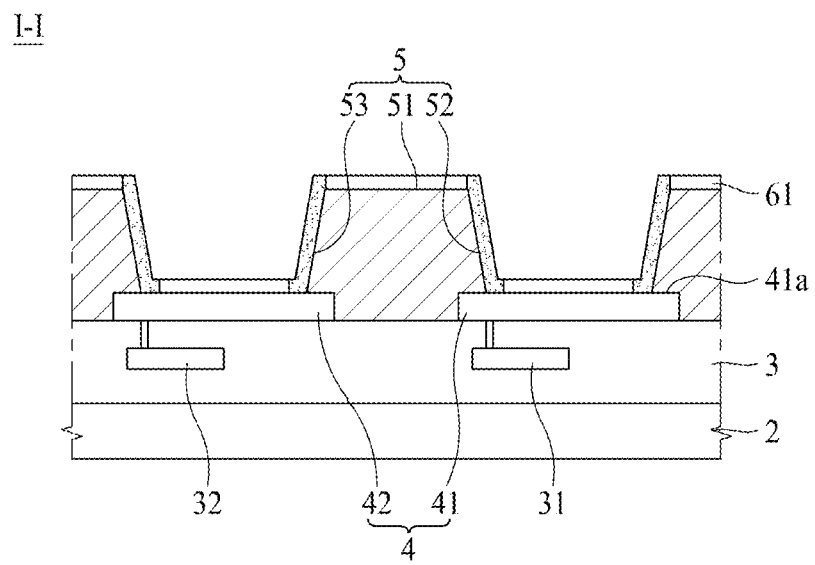

Next, referring to FIG. 5*c*, it is noted that the portion of the first stack 61, to which UV has been irradiated, has a characteristic which is varied due to the photoisomerization organic material. For example, the portion having a characteristic which is varied due to the photoisomerization organic material may be the first electron transporting layer 613 of the first stack 61.

Figure 5D:
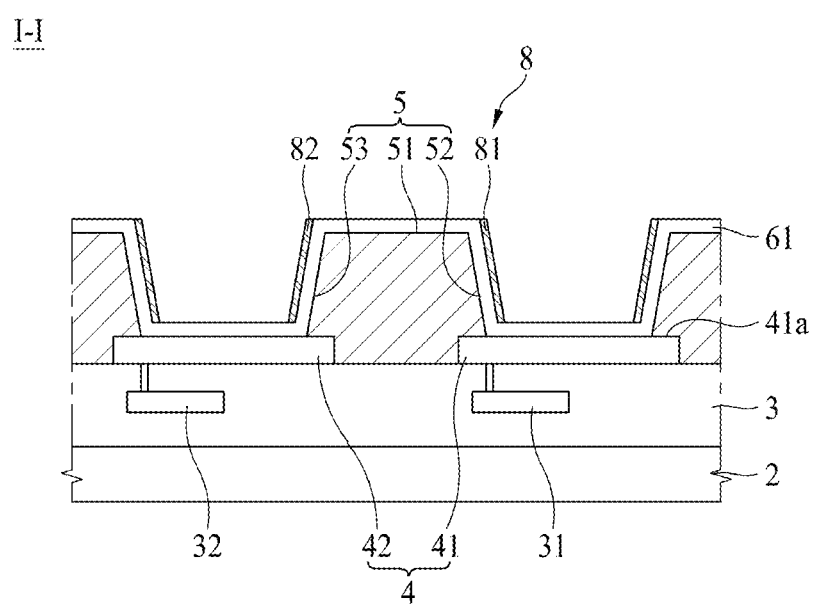

Next, referring to FIG. 5d, the reflective portion 8 containing metal is deposited on the first electron transporting layer 613. In this case, the reflective portion 8 may be deposited on only the first electron transporting layer 613 of which characteristic has been varied. Therefore, the reflective portion 8 may adjoin the organic layer of the organic light emitting layer 6. Therefore, in the display device 1 according to the fourth embodiment of the present disclosure, the reflective portion 8 may easily be deposited on the bank 5 by using the photoisomerization organic material and UV may be irradiated to only a desired area so that the reflective portion 8 may easily be deposited on the desired area.

Figure 5E:
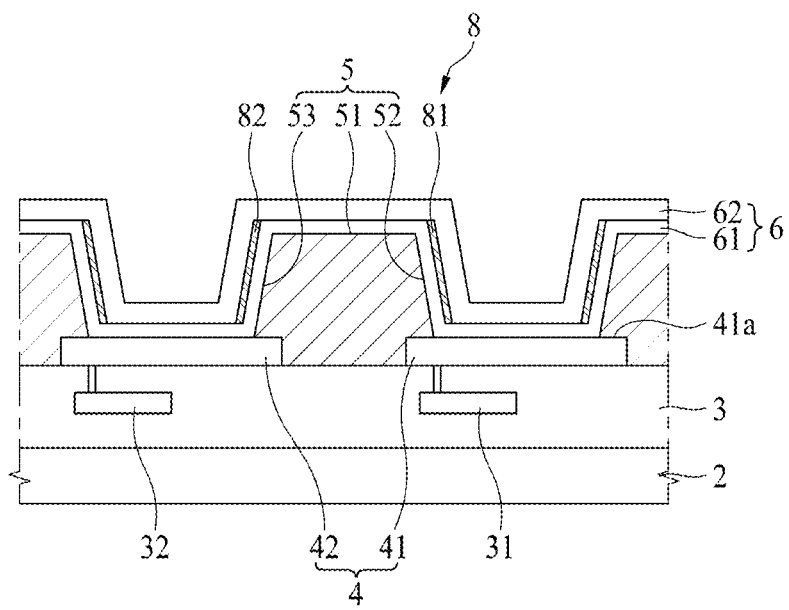

Next, referring to FIG. 5e, the second hole transporting layer 621, the second light emitting layer 622 and the second electron transporting layer 623 are sequentially deposited to form the second stack 62. In fourth embodiment of the present disclosure, the second electron transporting layer 623 includes a photoisomerization organic material, and the steps of FIGS. 5b to 5d are repeated so that the reflective portion 8 is additionally provided on the second electron transporting layer 623, whereby the reflective portion 8 may doubly be provided on the bank 5.

Figure 5F:
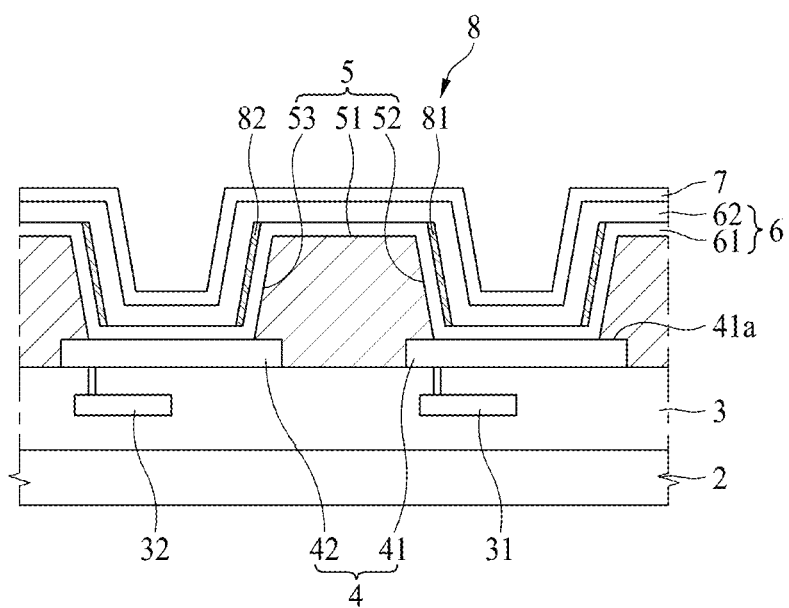

Next, referring to FIG. 5f, the second electrode 7 is formed on the second stack 62. The second electrode 7 may be formed in a single body with the first subpixel area 21 and the second subpixel area 22 so that the second electrode 7 may be a common layer for the first subpixel area 21 and the second subpixel area 22.

Figure 5G:
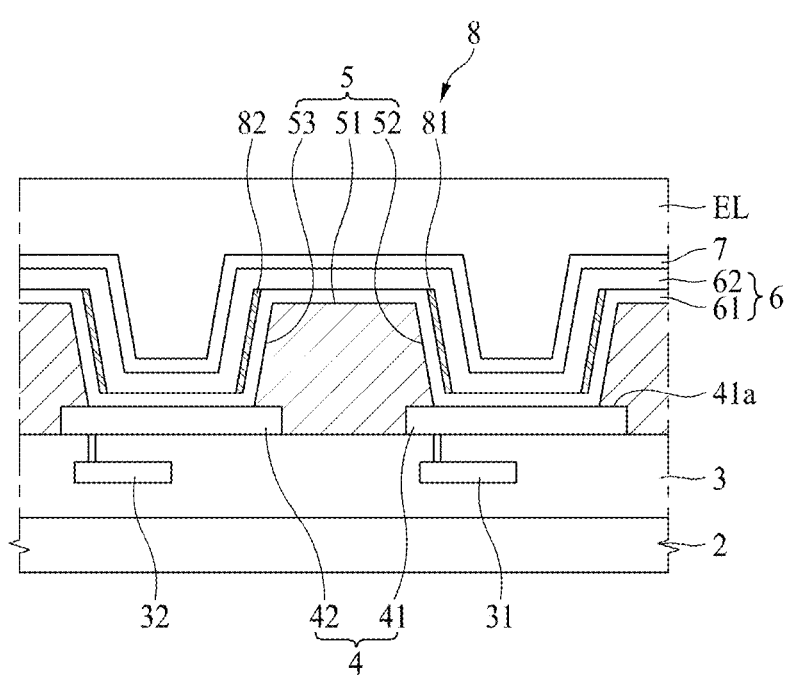

Next, referring to FIG. 5g, the encapsulation layer EL may be formed on the second electrode 7. The encapsulation layer EL may include at least one inorganic film and at least one organic film.

In the display device 1 according to one embodiment of the present disclosure, the reflective portion 8 may easily be deposited on at least one of the inside and the outside of the organic light emitting layer 6 through the aforementioned process order by using the photoisomerization organic material. Therefore, in the display device 1 according to one embodiment of the present disclosure, easiness of manufacture of the complete display device may be more increased than the case that the reflective portion 8 is formed without using the photoisomerization organic material, whereby the manufacturing time of the complete display device may be reduced.

Figure 6A:
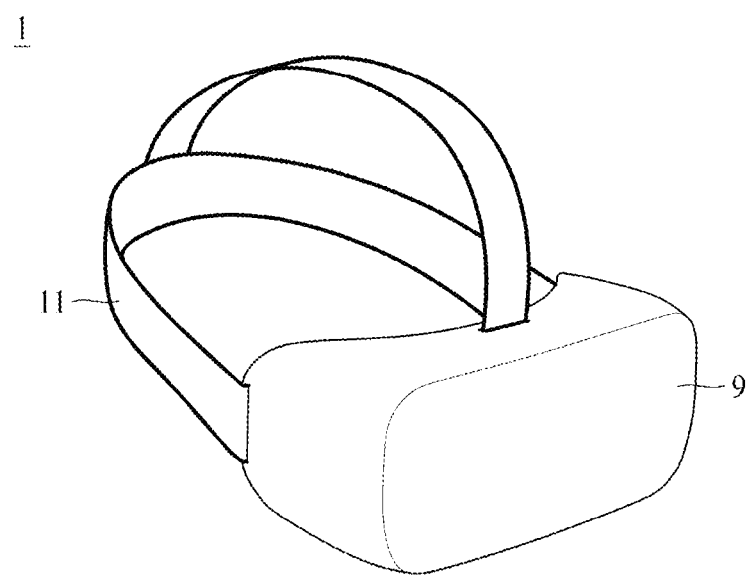
FIG. 6a is an exemplary view illustrating a display device according to one embodiment of the present disclosure.
Figure 6B:
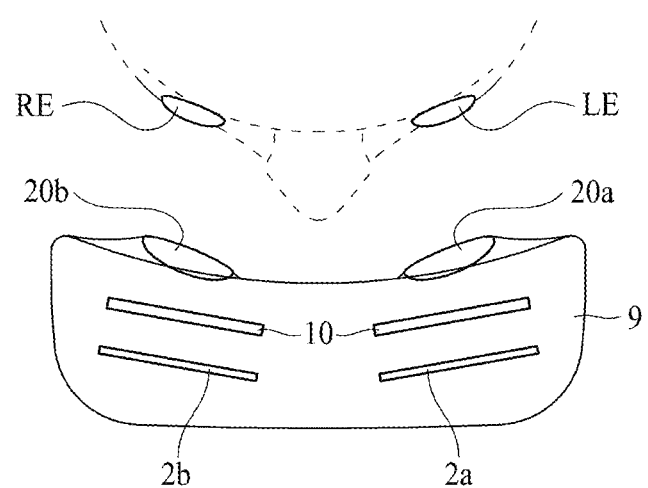

FIG. 6a is an exemplary view illustrating a display device according to one embodiment of the present disclosure, and FIG. 6b is an exemplary view illustrating a storage case of FIG. 6a.

Referring to FIGS. 6a and 6b, the display device according to one embodiment of the present disclosure may further comprise a storage case 9, a left eye lens 20a, a right eye lens 20b, a lens array 10, and a head mounted band 11.

The storage case 9 stores the substrate 2, and provides the left eye lens 20a and the right eye lens 20b with images of the substrate 2. In detail, the storage case 9, as shown in FIG. 6b, may include a left eye substrate 2a arranged in front of the left eye lens 20a and a right eye substrate 2b arranged in front of the right eye lens 20b.

The left eye substrate 2a and the right eye substrate 2b may display the same image, and in this case, a user may view 2D image. Alternatively, the left eye substrate 2a may display a left eye image and the right eye substrate 2b may display a right eye image, and in this case, a user may view a 3D image.

Each of the left eye substrate 2a and the right eye substrate 2b may be an organic light emitting display device.

Each of the left eye substrate 2a and the right eye substrate 2b may include a plurality of subpixel areas, a first electrode 4, a bank 5, a second electrode 7, and a reflective portion 8, and may display various images by combining colors of light emitted from each of the subpixel areas in various manners.

Meanwhile, the storage case 9, as shown in FIG. 6b, may further include a lens array 10 respectively arranged between the left eye substrate 2a and left eye lens 20a and between the right eye substrate 2b and the right eye lens 20b. The lens array 10 may be a micro lens array. The lens array 10 may be replaced with a pin hole array. Due to the lens array 10, images displayed on the left eye substrate 2a or the right eye substrate 2b may be viewed to be magnified to a user.

A left eye LE of a user may be arranged in the left eye lens 20a, and a right eye RE of a user may be arranged in the right eye lens 20b. That is, the left eye lens 20a and the right eye lens 20b correspond to an ocular lens arranged in front of the display device 2.

The head mounted band 11 is fixed to the storage case 9. The head mounted band 11 is formed to surround a top surface and both sides of a user's head, but is not limited to this example. The head mounted band 11 is to fix a head mounted display to a user's head and may be formed in a shape of a glasses frame or a helmet shape.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
    a substrate provided with a first subpixel area, and a second subpixel area adjacent to one side of the first subpixel area;
    a first electrode provided on the substrate, including a first sub electrode provided on the first subpixel area and a second sub electrode provided on the second subpixel area;
    an organic light emitting layer arranged on the first electrode;
    a second electrode arranged on the organic light emitting layer;
    a bank provided between the first sub electrode and the second sub electrode, partitioning the first subpixel area from the second subpixel area; and
    a reflective portion provided on the bank, adjoining the organic light emitting layer,
    wherein the organic light emitting layer includes a plurality of organic layers, and an organic layer provided below the reflective portion while adjoining the reflective portion includes a photoisomerization organic material.

2. The display device of claim 1, wherein the reflective portion is arranged inside the organic light emitting layer.

3. The display device of claim 2, wherein the organic light emitting layer includes a plurality of organic layers, and the reflective portion is provided between any two of the plurality of organic layers.

4. The display device of claim 3, wherein the plurality of organic layers include a first stack including a first hole transporting layer, a first light emitting layer emitting light of a first color, and a first electron transporting layer, a second stack including a second hole transporting layer, a second light emitting layer emitting light of a second color, and a second electron transporting layer, and a charge generating layer provided between the first stack and the second stack, and the reflective portion is provided on a top surface of the first electron transporting layer.

5. The display device of claim 4, wherein the first electron transporting layer includes a photoisomerization organic material.

6. The display device of claim 1, wherein the reflective portion includes a plurality of layers that include a first layer provided inside the organic light emitting layer and a second layer provided inside or on a top surface of the organic light emitting layer while being spaced apart from the first layer.

7. The display device of claim 1, wherein the reflective portion includes metal.

8. The display device of claim 1, wherein the bank includes a top surface and a first inclined surface extended from the top surface to a top surface of the first sub electrode, and the reflective portion includes a first reflective portion arranged on the first inclined surface.

9. The display device of claim 8, wherein the first reflective portion is extended to the top surface of the bank.

10. The display device of claim 8, wherein the bank includes a second inclined surface extended from the top surface to a top surface of the second sub electrode, and the reflective portion includes a second reflective portion arranged on the second inclined surface.

11. The display device of claim 10, wherein the second reflective portion is extended to the top surface of the bank.

12. The display device of claim 11, wherein the second reflective portion and the first reflective portion are spaced apart from each other on the top surface of the bank.

13. The display device of claim 1, further comprising a lens array including a plurality of lenses arranged in front of the substrate, magnifying images displayed on the subpixel areas, and a storage case for storing the substrate and the lens array.

14. A display device, comprising:
a substrate provided with a first subpixel area, and a second subpixel area adjacent to one side of the first subpixel area;
a first electrode provided on the substrate, including a first sub electrode provided on the first subpixel area and a second sub electrode provided on the second subpixel area;
an organic light emitting layer arranged on the first electrode;
a second electrode arranged on the organic light emitting layer;
a bank provided between the first sub electrode and the second sub electrode, partitioning the first subpixel area from the second subpixel area; and
a reflective portion provided on the bank, adjoining the organic light emitting layer,
wherein the organic light emitting layer includes a plurality of organic layers, and the reflective portion is arranged on an organic layer including a photoisomerization organic material.

15. The display device of claim 14, wherein the organic light emitting layer includes a hole transporting layer, a light emitting layer, and an electron transporting layer, and the reflective portion is provided on a top surface of the electron transporting layer.

16. The display device of claim 15, wherein the electron transporting layer includes a photoisomerization organic material.

17. The display device of claim 14, wherein the organic layer is provided below the reflective portion while adjoining the reflective portion.

18. The display device of claim 14, further comprising a lens array including a plurality of lenses arranged in front of the substrate, magnifying images displayed on the subpixel areas, and a storage case for storing the substrate and the lens array.

19. A display device comprising:
a first electrode including a first sub electrode and a second sub electrode;
an organic light emitting layer including a plurality of organic layers and arranged on the first electrode;
a second electrode arranged on the organic light emitting layer;
a bank provided between the first sub electrode and the second sub electrode for defining a subpixel area, the bank including a top surface, a first inclined surface extending from the top surface of the bank to a top surface of the first sub electrode, and a second inclined surface extending from the top surface of the bank to a top surface of the second sub electrode; and
a reflective portion provided on the bank for reflecting light moving to the bank after being emitted from respective subpixel area to the respective subpixel area,
wherein an organic layer provided below the reflective portion while adjoining the reflective portion includes a photoisomerization organic material.

20. The display device of claim 19, wherein the reflective portion is provided inside and/or on the organic light emitting layer.

* * * * *